United States Patent
Kato et al.

(10) Patent No.: US 12,102,013 B2
(45) Date of Patent: Sep. 24, 2024

(54) MAGNETIC DETECTION DEVICE

(71) Applicant: Mitsubishi Electric Corporation, Tokyo (JP)

(72) Inventors: Yusuke Kato, Tokyo (JP); Tetsuo Amano, Tokyo (JP); Hideki Shimauchi, Tokyo (JP); Akira Koshimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 467 days.

(21) Appl. No.: 17/558,849

(22) Filed: Dec. 22, 2021

(65) Prior Publication Data

US 2022/0310904 A1    Sep. 29, 2022

(30) Foreign Application Priority Data

Mar. 25, 2021   (JP) .................................. 2021-051887

(51) Int. Cl.
*H10N 50/80* (2023.01)
*H01L 25/10* (2006.01)

(52) U.S. Cl.
CPC .............. *H10N 50/80* (2023.02); *H01L 25/10* (2013.01)

(58) Field of Classification Search
CPC ................................. H10N 50/80; H01L 25/10
See application file for complete search history.

(56) References Cited

U.S. PATENT DOCUMENTS

| 9,594,127 | B2 | 3/2017 | Wu et al. |
| 9,689,711 | B2 | 6/2017 | Mizunuma et al. |
| 2015/0177023 | A1* | 6/2015 | Klocke ............... G01D 5/12 |
| | | | 324/207.25 |
| 2017/0219382 | A1* | 8/2017 | Ausserlechner ... G01R 33/0047 |

FOREIGN PATENT DOCUMENTS

| JP | 2015-121459 A | 7/2015 |
| JP | 5949748 B2 | 7/2016 |
| JP | 6347517 B2 | 6/2018 |

* cited by examiner

*Primary Examiner* — Fernando L Toledo
*Assistant Examiner* — Neil R Prasad
(74) *Attorney, Agent, or Firm* — Sughrue Mion, PLLC; Richard C. Turner

(57) ABSTRACT

A magnetic detection device includes a first magnetic sensor, a second magnetic sensor, and a resin body. The first magnetic sensor includes a first sealing body and first terminals. The second magnetic sensor includes a second sealing body and second terminals. The resin body includes a resin-body main body, first wiring lines, and second wiring lines. Each of the first wiring lines includes a first overlapping portion overlapping with corresponding one of the first terminals. As viewed in a normal direction of each of the first terminals, the first overlapping portion is arranged at a position shifted from all of the second terminals and the second wiring lines. Each of the first wiring lines is welded to corresponding one of the first terminals at the first overlapping portion.

7 Claims, 7 Drawing Sheets

MAGNETIC DETECTION DEVICE

BACKGROUND OF THE INVENTION

Field of the Invention

This disclosure relates to a magnetic detection device including two magnetic sensors.

Description of the Related Art

In Patent Literature 1, there is described a position detecting device including two magnetic sensors. The position detecting device includes a first sensor component, and a second sensor component having the same configuration as that of the first sensor component. Each of the first sensor component and the second sensor component includes a magnetic sensor, a wiring line welded to a terminal of the magnetic sensor, and a mold resin body configured to hold the magnetic sensor and the wiring line. The first sensor component and the second sensor component are held by different mold resin bodies under a state in which the first sensor component and the second sensor component are arranged so as to be opposed to each other.

CITATION LIST

Patent Literature

[PTL 1] JP 5949748 B2

When the above-mentioned position detecting device is manufactured, there are required a step of molding components forming the first sensor component with a resin, a step of molding components forming the second sensor component with a resin, and a step of further molding the first sensor component and the second sensor component with a resin. As a result, the above-mentioned position detecting device is increased in the number of manufacturing steps.

In order to reduce the number of manufacturing steps, it is conceivable to combine the two magnetic sensors and a resin body molded in advance with each other, and then weld a terminal of each magnetic sensor to a wiring line formed in the resin body. In the resin body, a wiring line to be connected to a terminal of one magnetic sensor and a wiring line to be connected to a terminal of the other magnetic sensor are insert-molded in advance.

In general, resistance welding is used for welding between a terminal and a wiring line. When the resistance welding is performed, the overlapped terminal and wiring line are sandwiched between a pair of welding electrodes from both sides, and a current is caused to flow between the pair of welding electrodes while pressure is applied to the terminal and the wiring line by the pair of welding electrodes. In this manner, a contact part between the terminal and the wiring line is melted by Joule heat so that the terminal and the wiring line are welded to each other.

However, under a state in which the two magnetic sensors and the resin body are combined with each other, the terminals of the two magnetic sensors all protrude in the same direction. Thus, when the terminal of the one magnetic sensor and the wiring line are welded to each other, the welding electrode may interfere with the terminal of the other magnetic sensor. Accordingly, there has been a problem in that it is sometimes difficult to weld the terminal of each magnetic sensor and the wiring line to each other.

SUMMARY OF THE INVENTION

This disclosure has been made to solve the above-mentioned problem, and has an object to provide a magnetic detection device with which, in the magnetic detection device including two magnetic sensors, a terminal of each magnetic sensor and a wiring line can be easily welded to each other.

According to at least one embodiment of this disclosure, there is provided a magnetic detection device, including: a first magnetic sensor; a second magnetic sensor arranged so as to be opposed to the first magnetic sensor; and a resin body provided between the first magnetic sensor and the second magnetic sensor, wherein the first magnetic sensor includes: a first sealing body in which a first detection element is sealed; and a plurality of first terminals each of which protrudes from the first sealing body in one direction, and are arranged side by side with respect to each other, wherein each of the plurality of first terminals has a plate shape along an arrangement direction of the plurality of first terminals, wherein the second magnetic sensor includes: a second sealing body in which a second detection element is sealed; and a plurality of second terminals each of which protrudes from the second sealing body in the same direction as a protruding direction of each of the plurality of first terminals, and are arranged side by side with respect to each other, wherein each of the plurality of second terminals has a plate shape which is parallel to each of the plurality of first terminals, wherein the resin body includes: a resin-body main body; a plurality of first wiring lines formed on a surface of the resin-body main body on the first magnetic sensor side; and a plurality of second wiring lines formed on a surface of the resin-body main body on the second magnetic sensor side, wherein each of the plurality of first wiring lines has a plate shape which is parallel to each of the plurality of first terminals, wherein each of the plurality of first wiring lines includes a first overlapping portion overlapping with corresponding one of the plurality of first terminals, wherein, as viewed in a normal direction of each of the plurality of first terminals, the first overlapping portion is arranged at a position shifted from all of the plurality of second terminals and the plurality of second wiring lines, wherein each of the plurality of first wiring lines is welded to corresponding one of the plurality of first terminals at the first overlapping portion, wherein each of the plurality of second wiring lines has a plate shape which is parallel to each of the plurality of first terminals, wherein each of the plurality of second wiring lines includes a second overlapping portion overlapping with corresponding one of the plurality of second terminals, wherein, as viewed in the normal direction, the second overlapping portion is arranged at a position shifted from all of the plurality of first terminals and the plurality of first wiring lines, and wherein each of the plurality of second wiring lines is welded to corresponding one of the plurality of second terminals at the second overlapping portion.

According to this disclosure, in the magnetic detection device including two magnetic sensors, a terminal of each magnetic sensor and a wiring line can be easily welded to each other.

DESCRIPTION OF THE EMBODIMENTS

First Embodiment

Figure 1:
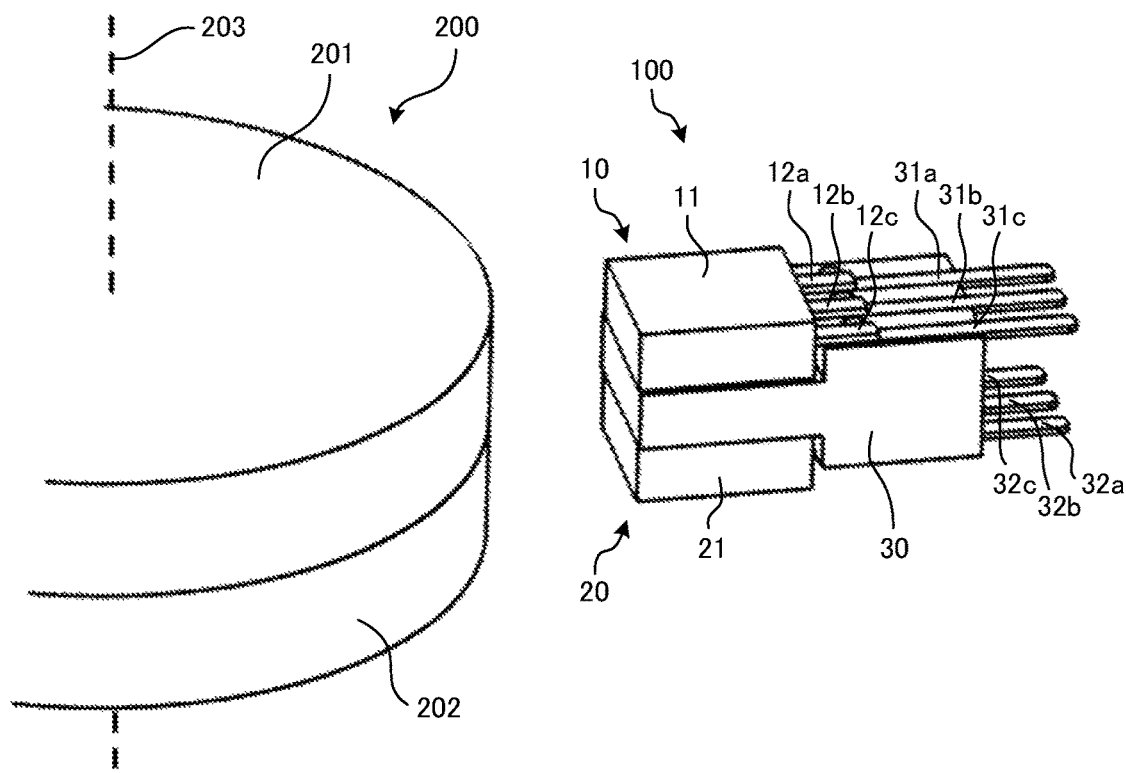
FIG. 1 is a perspective view for illustrating a configuration of a magnetic detection device according to a first embodiment.

A magnetic detection device according to a first embodiment is described. FIG. 1 is a perspective view for illustrating a configuration of the magnetic detection device according to the first embodiment. As illustrated in FIG. 1, a magnetic detection device 100 is arranged on a radially outer side of a magnetic rotating body 200 being a detection target. The magnetic detection device 100 is opposed to an outer peripheral surface of the magnetic rotating body 200 via a gap. The magnetic detection device 100 is configured to detect the number of rotations or a rotation angle of the magnetic rotating body 200 based on a change in a magnetic field caused by the rotation of the magnetic rotating body 200.

The magnetic rotating body 200 includes a first magnetic rotating body 201 and a second magnetic rotating body 202. The first magnetic rotating body 201 and the second magnetic rotating body 202 are configured to integrally rotate about a rotation axis 203. The first magnetic rotating body 201 and the second magnetic rotating body 202 are adjacent to each other in a direction along the rotation axis 203. At least an outer peripheral portion of each of the first magnetic rotating body 201 and the second magnetic rotating body 202 is made of a magnetic material. Each of the first magnetic rotating body 201 and the second magnetic rotating body 202 may be a gear having unevenness on an outer peripheral portion thereof, or a magnetized plate having a magnetized outer peripheral portion.

The magnetic detection device 100 includes a first magnetic sensor 10, a second magnetic sensor 20 arranged so as to be opposed to the first magnetic sensor 10, and a resin body 30 provided between the first magnetic sensor 10 and the second magnetic sensor 20. The first magnetic sensor 10 is an integrated circuit (IC) package including a first detection element (not shown) configured to detect a magnetic field of the first magnetic rotating body 201. The second magnetic sensor 20 is an IC package including a second detection element (not shown) configured to detect a magnetic field of the second magnetic rotating body 202. From the first magnetic sensor 10 and the second magnetic sensor 20, signals different from each other are output. The first magnetic sensor 10 and the second magnetic sensor 20 are opposed to each other across a plane perpendicular to the rotation axis 203 of the magnetic rotating body 200. In the following, the up-and-down direction of FIG. 1 in which the first magnetic sensor 10 and the second magnetic sensor 20 face each other is sometimes referred to as "thickness direction of the magnetic detection device 100." The thickness direction of the magnetic detection device 100 is parallel to the rotation axis 203.

Figure 2:
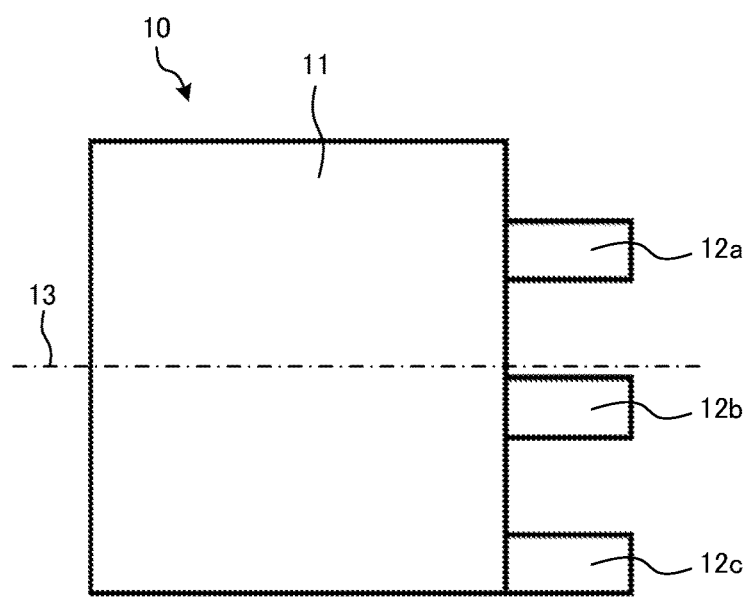
FIG. 2 is a top view for illustrating a configuration of a first magnetic sensor of the magnetic detection device according to the first embodiment.

FIG. 2 is a top view for illustrating a configuration of the first magnetic sensor of the magnetic detection device according to the first embodiment. FIG. 2 shows the configuration of the first magnetic sensor 10 as viewed from the upper side of FIG. 1. As illustrated in FIG. 2, the first magnetic sensor 10 includes a first sealing body 11 and a plurality of first terminals 12a, 12b, and 12c. The first sealing body 11 has a cuboid shape. Inside the first sealing body 11, the first detection element configured to detect the magnetic field of the first magnetic rotating body 201 is sealed.

The first terminal 12a, the first terminal 12b, and the first terminal 12c each protrude from one side of the first sealing body 11 in one direction, in top view of the first magnetic sensor 10 as illustrated in FIG. 2. The first terminal 12a, the first terminal 12b, and the first terminal 12c are arranged side by side with respect to each other at certain intervals. An arrangement direction of the first terminal 12a, the first terminal 12b, and the first terminal 12c corresponds to the up-and-down direction of FIG. 2. The first terminal 12a, the first terminal 12b, and the first terminal 12c are arrayed in the stated order from the upper side to the lower side of FIG. 2.

Each of the first terminal 12a, the first terminal 12b, and the first terminal 12c is a plate-shaped terminal having a plate shape along the above-mentioned arrangement direction. In the first embodiment, a normal direction of each of the first terminal 12a, the first terminal 12b, and the first terminal 12c is parallel to the thickness direction of the magnetic detection device 100. A width of each of the first terminal 12a, the first terminal 12b, and the first terminal 12c is the same or smaller than an interval between two first terminals adjacent to each other. In the first embodiment, three first terminals 12a, 12b, and 12c are provided, but the number of first terminals is not limited to three.

In FIG. 2, a center line 13 indicates a center of the first sealing body 11 in the arrangement direction of the first terminal 12a, the first terminal 12b, and the first terminal 12c. The first terminal 12a, the first terminal 12b, and the first terminal 12c are arranged asymmetrically with respect to the center line 13. Further, none of the first terminal 12a, the first terminal 12b, and the first terminal 12c is arranged on the center line 13.

Figure 3:
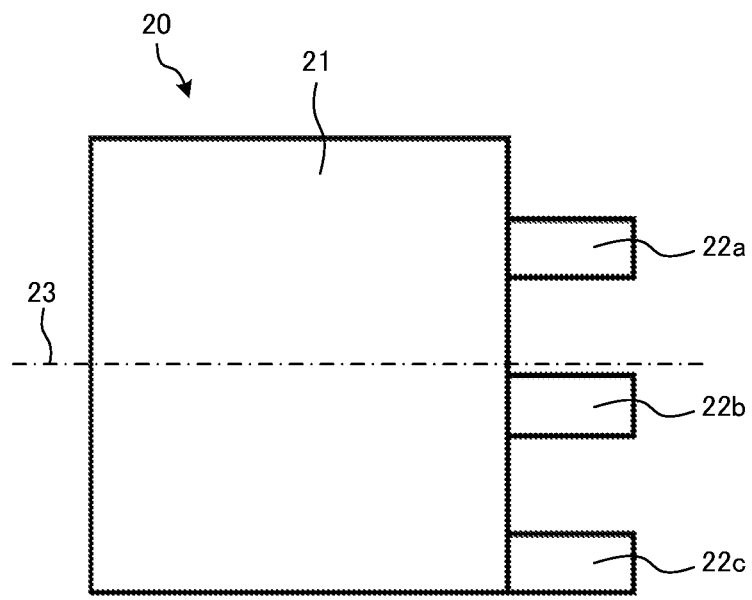
FIG. 3 is a top view for illustrating a configuration of a second magnetic sensor of the magnetic detection device according to the first embodiment.

FIG. 3 is a top view for illustrating a configuration of the second magnetic sensor of the magnetic detection device according to the first embodiment. FIG. 3 shows the configuration of the second magnetic sensor 20 as viewed from the lower side of FIG. 1. In the first embodiment, the second magnetic sensor 20 has the same shape as that of the first magnetic sensor 10. The first magnetic sensor 10 and the second magnetic sensor 20 may be common components having the same configuration.

As illustrated in FIG. 3, the second magnetic sensor 20 includes a second sealing body 21 and a plurality of second terminals 22a, 22b, and 22c. The second sealing body 21 has a cuboid shape. Inside the second sealing body 21, the second detection element configured to detect the magnetic field of the second magnetic rotating body 202 is sealed.

The second terminal 22a, the second terminal 22b, and the second terminal 22c each protrude from one side of the second sealing body 21 in one direction, in top view of the second magnetic sensor 20 as illustrated in FIG. 3. The second terminal 22a, the second terminal 22b, and the second terminal 22c are arranged side by side with respect to each other at certain intervals. An arrangement direction of the second terminal 22a, the second terminal 22b, and the second terminal 22c corresponds to the up-and-down direction of FIG. 3. The second terminal 22a, the second terminal 22b, and the second terminal 22c are arrayed in the stated order from the upper side to the lower side of FIG. 3.

Each of the second terminal 22a, the second terminal 22b, and the second terminal 22c is a plate-shaped terminal having a plate shape. In the magnetic detection device 100, each of the second terminal 22a, the second terminal 22b, and the second terminal 22c is parallel to each of the first terminal 12a, the first terminal 12b, and the first terminal 12c. That is, a normal direction of each of the second terminal 22a, the second terminal 22b, and the second terminal 22c is parallel to the normal direction of each of the first terminal 12a, the first terminal 12b, and the first terminal 12c. A width of each of the second terminal 22a, the second terminal 22b, and the second terminal 22c is the same or smaller than an interval between two second terminals adjacent to each other. In the first embodiment, three second terminals 22a, 22b, and 22c are provided, but the number of second terminals is not limited to three.

In FIG. 3, a center line 23 indicates a center of the second sealing body 21 in the arrangement direction of the second terminal 22a, the second terminal 22b, and the second terminal 22c. The second terminal 22a, the second terminal 22b, and the second terminal 22c are arranged asymmetrically with respect to the center line 23. Further, none of the second terminal 22a, the second terminal 22b, and the second terminal 22c is arranged on the center line 23.

Figure 4:
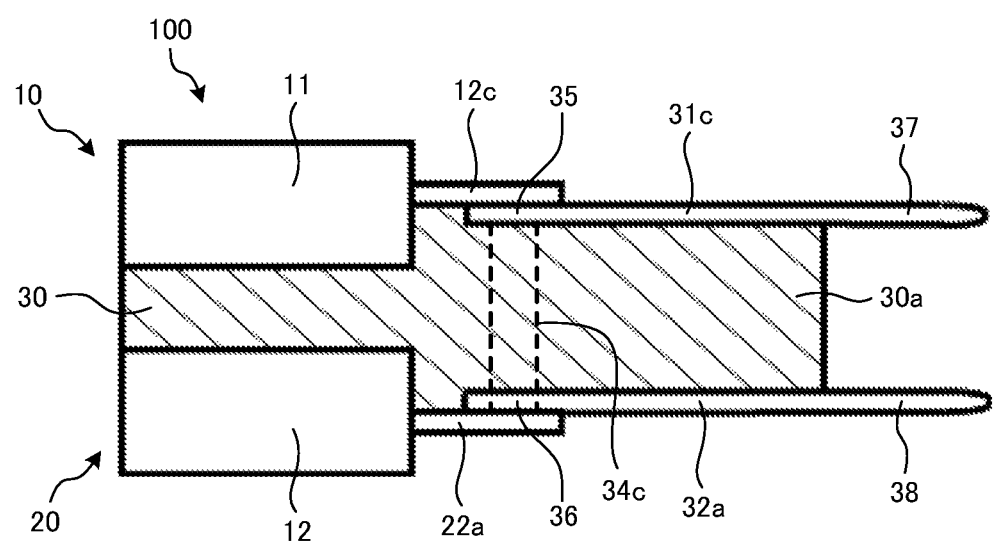
FIG. 4 is a side view for illustrating the configuration of the magnetic detection device according to the first embodiment.
Figure 5:
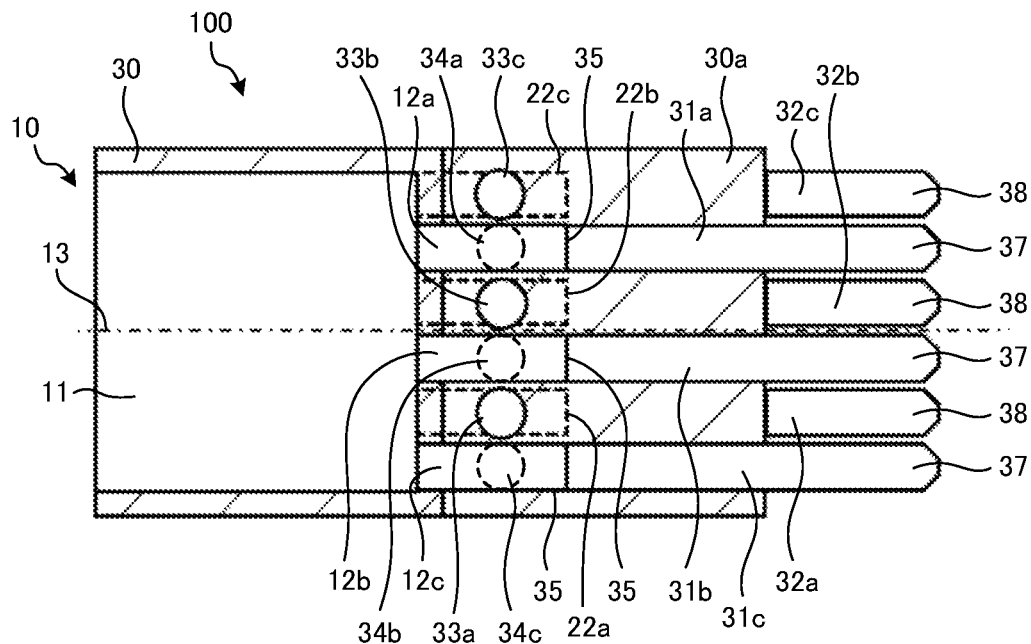
FIG. 5 is a top view for illustrating the configuration of the magnetic detection device according to the first embodiment.

FIG. 4 is a side view for illustrating the configuration of the magnetic detection device according to the first embodiment. FIG. 5 is a top view for illustrating the configuration of the magnetic detection device according to the first embodiment. FIG. 5 shows the configuration of the magnetic detection device 100 as viewed from the first magnetic sensor 10 side, along the normal direction of each of the first terminal 12a, the first terminal 12b, and the first terminal 12c. In FIG. 4 and FIG. 5, a resin-body main body 30a is illustrated with hatching.

As illustrated in FIG. 4 and FIG. 5, the resin body 30 includes the resin-body main body 30a, a plurality of first wiring lines 31a, 31b, and 31c, and a plurality of second wiring lines 32a, 32b, and 32c. The first wiring lines 31a, 31b, and 31c are formed on a surface of the resin-body main body 30a on the first magnetic sensor 10 side. The second wiring lines 32a, 32b, and 32c are formed on a surface of the resin-body main body 30a on the second magnetic sensor 20 side. The first wiring lines 31a, 31b, and 31c and the second wiring lines 32a, 32b, and 32c are formed integrally with the resin-body main body 30a by insert molding.

The first wiring line 31a, the first wiring line 31b, and the first wiring line 31c are arranged side by side along the arrangement direction of the first terminal 12a, the first terminal 12b, and the first terminal 12c. The first wiring line 31a, the first wiring line 31b, and the first wiring line 31c are arrayed in the stated order from the upper side to the lower side of FIG. 5. Each of the first wiring line 31a, the first wiring line 31b, and the first wiring line 31c extends linearly along a protruding direction of each of the first terminal 12a, the first terminal 12b, and the first terminal 12c. Each of the first wiring line 31a, the first wiring line 31b, and the first wiring line 31c has a plate shape which is parallel to each of the first terminal 12a, the first terminal 12b, and the first terminal 12c. That is, a normal direction of each of the first wiring line 31a, the first wiring line 31b, and the first wiring line 31c is parallel to the normal direction of each of the first terminal 12a, the first terminal 12b, and the first terminal 12c.

The first wiring line 31a includes, at one end portion thereof, a first overlapping portion 35 overlapping with the first terminal 12a. The first wiring line 31a overlaps with the first terminal 12a at the first overlapping portion 35 as viewed in the normal direction of the first wiring line 31a, and is also in contact with the first terminal 12a at the first overlapping portion 35. Similarly, each of the first wiring line 31b and the first wiring line 31c includes, at one end portion thereof, a first overlapping portion 35 overlapping with corresponding one of the first terminal 12b or the first terminal 12c. The first overlapping portion 35 serves as a contact electrode of each of the first wiring line 31a, the first wiring line 31b, and the first wiring line 31c. The first wiring line 31a is welded to the first terminal 12a at the first overlapping portion 35. Similarly, each of the first wiring line 31b and the first wiring line 31c is welded to corresponding one of the first terminal 12b or the first terminal 12c at the first overlapping portion 35. In the thickness direction of the magnetic detection device 100, the first overlapping portion 35 is positioned between the first terminal 12a and the resin-body main body 30a.

Further, each of the first wiring line 31a, the first wiring line 31b, and the first wiring line 31c includes, at the other end portion thereof, a connector terminal 37 protruding from the resin-body main body 30a. The connector terminal 37 is to be connected via a harness to a control device provided outside of the magnetic detection device 100.

The second wiring line 32a, the second wiring line 32b, and the second wiring line 32c are arranged side by side along the arrangement direction of the first wiring line 31a, the first wiring line 31b, and the first wiring line 31c. The second wiring line 32a, the second wiring line 32b, and the second wiring line 32c are arrayed in the stated order from the lower side to the upper side of FIG. 5. Each of the second wiring line 32a, the second wiring line 32b, and the second wiring line 32c extends linearly along a protruding direction of each of the second terminal 22a, the second terminal 22b, and the second terminal 22c. Each of the second wiring line 32a, the second wiring line 32b, and the second wiring line 32c has a plate shape which is parallel to each of the second terminal 22a, the second terminal 22b, and the second terminal 22c. That is, a normal direction of each of the second wiring line 32a, the second wiring line 32b, and the second wiring line 32c is parallel to the normal direction of each of the first terminal 12a, the first terminal 12b, the first terminal 12c, the second terminal 22a, the second terminal 22b, and the second terminal 22c.

The second wiring line 32a includes, at one end portion thereof, a second overlapping portion 36 overlapping with the second terminal 22a. Similarly, each of the second wiring line 32b and the second wiring line 32c includes, at one end portion thereof, a second overlapping portion 36 overlapping with corresponding one of the second terminal 22b or the second terminal 22c. The second overlapping portion 36 serves as a contact electrode of each of the second wiring line 32a, the second wiring line 32b, and the second wiring line 32c. The second wiring line 32a is welded to the second terminal 22a at the second overlapping portion 36. Similarly, each of the second wiring line 32b and the second wiring line 32c is welded to corresponding one of the second terminal 22b or the second terminal 22c at the second overlapping portion 36. In the thickness direction of the magnetic detection device 100, the second overlapping portion 36 is positioned between the second terminal 22a and the resin-body main body 30a.

Further, each of the second wiring line 32a, the second wiring line 32b, and the second wiring line 32c includes, at the other end portion thereof, a connector terminal 38 protruding from the resin-body main body 30a. The connector terminal 38 is to be connected via a harness to the control device provided outside of the magnetic detection device 100.

As viewed in the normal direction of the first terminal 12a, the first overlapping portion 35 of the first wiring line 31a is arranged at a position shifted from all of the second terminal 22a, the second terminal 22b, the second terminal 22c, the second wiring line 32a, the second wiring line 32b, and the second wiring line 32c. That is, as viewed in the above-mentioned normal direction, at least a part of the first overlapping portion 35 of the first wiring line 31a is prevented from overlapping with all of the second terminal 22a, the second terminal 22b, the second terminal 22c, the second wiring line 32a, the second wiring line 32b, and the second wiring line 32c.

Similarly, as viewed in the above-mentioned normal direction, the first overlapping portion 35 of each of the first wiring line 31b and the first wiring line 31c is arranged at a position shifted from all of the second terminal 22a, the second terminal 22b, the second terminal 22c, the second wiring line 32a, the second wiring line 32b, and the second wiring line 32c. That is, as viewed in the above-mentioned normal direction, at least a part of the first overlapping portion 35 of the first wiring line 31b is prevented from overlapping with all of the second terminal 22a, the second terminal 22b, the second terminal 22c, the second wiring line 32a, the second wiring line 32b, and the second wiring line 32c. Further, as viewed in the above-mentioned normal direction, at least a part of the first overlapping portion 35 of the first wiring line 31c is prevented from overlapping with all of the second terminal 22a, the second terminal 22b, the second terminal 22c, the second wiring line 32a, the second wiring line 32b, and the second wiring line 32c.

As viewed in the normal direction of the second terminal 22a, the second overlapping portion 36 of the second wiring line 32a is arranged at a position shifted from all of the first terminal 12a, the first terminal 12b, the first terminal 12c, the first wiring line 31a, the first wiring line 31b, and the first wiring line 31c. That is, as viewed in the above-mentioned normal direction, at least a part of the second overlapping portion 36 of the second wiring line 32a is prevented from overlapping with all of the first terminal 12a, the first terminal 12b, the first terminal 12c, the first wiring line 31a, the first wiring line 31b, and the first wiring line 31c.

Similarly, as viewed in the above-mentioned normal direction, the second overlapping portion 36 of each of the second wiring line 32b and the second wiring line 32c is arranged at a position shifted from all of the first terminal 12a, the first terminal 12b, the first terminal 12c, the first wiring line 31a, the first wiring line 31b, and the first wiring line 31c. That is, as viewed in the above-mentioned normal direction, at least a part of the second overlapping portion 36 of the second wiring line 32b is prevented from overlapping with all of the first terminal 12a, the first terminal 12b, the first terminal 12c, the first wiring line 31a, the first wiring line 31b, and the first wiring line 31c. Further, as viewed in the above-mentioned normal direction, at least a part of the second overlapping portion 36 of the second wiring line 32c is prevented from overlapping with all of the first terminal 12a, the first terminal 12b, the first terminal 12c, the first wiring line 31a, the first wiring line 31b, and the first wiring line 31c.

In the surface of the resin-body main body 30a on the first magnetic sensor 10 side, a plurality of first holes 33a, 33b, and 33c are formed. The first hole 33a is formed at a position at which, as viewed in the normal direction of the second wiring line 32a, the first hole 33a overlaps with the second overlapping portion 36 of the second wiring line 32a. The first hole 33a extends in the normal direction of the second wiring line 32a, and passes through the resin-body main body 30a to reach the second overlapping portion 36 of the second wiring line 32a.

Similarly, each of the first hole 33b and the first hole 33c is formed at a position at which, as viewed in the normal direction of each of the second wiring line 32b and the second wiring line 32c, each of the first hole 33b and the first hole 33c overlaps with the second overlapping portion 36 of corresponding one of the second wiring line 32b or the second wiring line 32c. The first hole 33b extends in the normal direction of the second wiring line 32b, and passes through the resin-body main body 30a to reach the second overlapping portion 36 of the second wiring line 32b. The first hole 33c extends in the normal direction of the second wiring line 32c, and passes through the resin-body main body 30a to reach the second overlapping portion 36 of the second wiring line 32c.

In the surface of the resin-body main body 30a on the second magnetic sensor 20 side, a plurality of second holes 34a, 34b, and 34c are formed. The second hole 34a is formed at a position at which, as viewed in the normal direction of the first wiring line 31a, the second hole 34a overlaps with the first overlapping portion 35 of the first wiring line 31a. The second hole 34a extends in the normal direction of the first wiring line 31a, and passes through the resin-body main body 30a to reach the first overlapping portion 35 of the first wiring line 31a.

Similarly, each of the second hole 34b and the second hole 34c is formed at a position at which, as viewed in the normal direction of each of the first wiring line 31b and the first wiring line 31c, each of the second hole 34b and the second hole 34c overlaps with the first overlapping portion 35 of corresponding one of the first wiring line 31b or the first wiring line 31c. The second hole 34b extends in the normal direction of the first wiring line 31b, and passes through the resin-body main body 30a to reach the first overlapping portion 35 of the first wiring line 31b. The second hole 34c extends in the normal direction of the first wiring line 31c, and passes through the resin-body main body 30a to reach the first overlapping portion 35 of the first wiring line 31c.

Steps of manufacturing the magnetic detection device 100 are briefly described. In the steps of manufacturing the magnetic detection device 100, first, each of the first magnetic sensor 10, the second magnetic sensor 20, and the resin body 30 is manufactured. The first magnetic sensor 10 and the second magnetic sensor 20 may be common components having the same configuration. The resin body 30 is formed by insert molding using the first wiring lines 31a, 31b, and 31c and the second wiring lines 32a, 32b, and 32c as insert components.

Next, the first magnetic sensor 10, the second magnetic sensor 20, and the resin body 30 are combined with each other so that the first magnetic sensor 10 and the second magnetic sensor 20 are opposed to each other across the resin body 30. In the resin body 30, a recessed portion to which a part of the first sealing body 11 is fitted, and a recessed portion to which a part of the second sealing body 21 is fitted are formed. Accordingly, when the first magnetic sensor 10, the second magnetic sensor 20, and the resin body 30 are combined with each other, the first magnetic sensor 10 and the second magnetic sensor 20 are positioned with respect to the resin body 30.

Next, the first terminal 12a, the first terminal 12b, and the first terminal 12c of the first magnetic sensor 10 are welded to the first wiring line 31a, the first wiring line 31b, and the first wiring line 31c of the resin body 30, respectively, by using resistance welding.

For example, when the first terminal 12c and the first wiring line 31c illustrated in FIG. 4 are welded to each other, one welding electrode is pressed against the first terminal 12c from the upper side of FIG. 4, and the other welding electrode is inserted into the second hole 34c from the lower side of FIG. 4 to be pressed against the first overlapping portion 35 of the first wiring line 31c. While pressure is applied to the first terminal 12c and the first wiring line 31c by the two welding electrodes, a current is caused to flow between the two welding electrodes so that the first terminal 12c and the first wiring line 31c are welded to each other.

Similarly, the second terminal 22a, the second terminal 22b, and the second terminal 22c of the second magnetic sensor 20 are welded to the second wiring line 32a, the second wiring line 32b, and the second wiring line 32c of the resin body 30, respectively, by using resistance welding. Through the above-mentioned steps, the magnetic detection device 100 is manufactured.

As described above, the magnetic detection device 100 according to the first embodiment includes the first magnetic sensor 10, the second magnetic sensor 20 arranged so as to be opposed to the first magnetic sensor 10, and the resin body 30 provided between the first magnetic sensor 10 and the second magnetic sensor 20. The first magnetic sensor 10 includes the first sealing body 11 in which the first detection element is sealed, and the plurality of first terminals 12a, 12b, and 12c each of which protrudes from the first sealing body 11 in one direction, and are arranged side by side with respect to each other. Each of the plurality of first terminals 12a, 12b, and 12c has a plate shape along the arrangement direction of the plurality of first terminals 12a, 12b, and 12c. The second magnetic sensor 20 includes the second sealing body 21 in which the second detection element is sealed, and the plurality of second terminals 22a, 22b, and 22c each of which protrudes from the second sealing body 21 in the same direction as the protruding direction of each of the plurality of first terminals 12a, 12b, and 12c, and are arranged side by side with respect to each other. Each of the plurality of second terminals 22a, 22b, and 22c has a plate shape which is parallel to each of the plurality of first terminals 12a, 12b, and 12c. The resin body 30 includes the resin-body main body 30a, the plurality of first wiring lines 31a, 31b, and 31c, and the plurality of second wiring lines 32a, 32b, and 32c. The plurality of first wiring lines 31a, 31b, and 31c are formed on the surface of the resin-body main body 30a on the first magnetic sensor 10 side. The plurality of second wiring lines 32a, 32b, and 32c are formed on the surface of the resin-body main body 30a on the second magnetic sensor 20 side. Each of the plurality of first wiring lines 31a, 31b, and 31c has a plate shape which is parallel to each of the plurality of first terminals 12a, 12b, and 12c. Each of the plurality of first wiring lines 31a, 31b, and 31c includes the first overlapping portion 35 overlapping with corresponding one of the plurality of first terminals 12a, 12b, and 12c. As viewed in the normal direction of each of the plurality of first terminals 12a, 12b, and 12c, the first overlapping portion 35 is arranged at a position shifted from all of the plurality of second terminals 22a, 22b, and 22c and the plurality of second wiring lines 32a, 32b, and 32c. Each of the plurality of first wiring lines 31a, 31b, and 31c is welded to corresponding one of the plurality of first terminals 12a, 12b, and 12c at the first overlapping portion 35. Each of the plurality of second wiring lines 32a, 32b, and 32c has a plate shape which is parallel to each of the plurality of first terminals 12a, 12b, and 12c. Each of the plurality of second wiring lines 32a, 32b, and 32c includes the second overlapping portion 36 overlapping with corresponding one of the plurality of second terminals 22a, 22b, and 22c. As viewed in the above-mentioned normal direction, the second overlapping portion 36 is arranged at a position shifted from all of the plurality of first terminals 12a, 12b, and 12c and the plurality of first wiring lines 31a, 31b, and 31c. Each of the plurality of second wiring lines 32a, 32b, and 32c is welded to corresponding one of the plurality of second terminals 22a, 22b, and 22c at the second overlapping portion 36.

With this configuration, when the first wiring line and the first terminal are welded to each other at the first overlapping portion 35, interference between the welding electrode and any of the plurality of second terminals 22a, 22b, and 22c and the plurality of second wiring lines 32a, 32b, and 32c can be prevented. Further, when the second wiring line and the second terminal are welded to each other at the second overlapping portion 36, interference between the welding electrode and any of the plurality of first terminals 12a, 12b, and 12c and the plurality of first wiring lines 31a, 31b, and 31c can be prevented. Thus, with the above-mentioned configuration, in the magnetic detection device 100 including the first magnetic sensor 10 and the second magnetic sensor 20, the terminal of each of the first magnetic sensor 10 and the second magnetic sensor 20 and the wiring line can be easily welded to each other. Further, with the above-mentioned configuration, both of welding between the first wiring line and the first terminal and welding between the second wiring line and the second terminal can be performed by processing in a uniaxial direction.

In the magnetic detection device according to the first embodiment, in the surface of the resin-body main body 30a on the first magnetic sensor 10 side, the plurality of first holes 33a, 33b, and 33c are formed. Each of the plurality of first holes 33a, 33b, and 33c extends in the above-mentioned normal direction to reach the second overlapping portion 36 of corresponding one of the plurality of second wiring lines 32a, 32b, and 32c. In the surface of the resin-body main body 30a on the second magnetic sensor 20 side, the plurality of second holes 34a, 34b, and 34c are formed. Each of the plurality of second holes 34a, 34b, and 34c extends in the above-mentioned normal direction to reach the first overlapping portion 35 of corresponding one of the plurality of first wiring lines 31a, 31b, and 31c.

With this configuration, a space required when the first wiring line and the first terminal are welded to each other is ensured along the normal direction of the first overlapping portion 35. For example, when the first terminal 12c and the first wiring line 31c are welded to each other, one welding electrode is pressed against the first terminal 12c, and the other welding electrode is inserted into the second hole 34c to be pressed against the first overlapping portion 35 of the first wiring line 31c. Accordingly, the welding between the first terminal 12c and the first wiring line 31c can be easily performed.

Further, a space required when the second wiring line and the second terminal are welded to each other is ensured along the normal direction of the second overlapping portion 36. For example, when the second terminal 22a and the second wiring line 32a are welded to each other, one welding electrode is inserted into the first hole 33a to be pressed against the second overlapping portion 36 of the second wiring line 32a, and the other welding electrode is pressed against the second terminal 22a. Accordingly, the welding between the second terminal 22c and the second wiring line 32c can be easily performed.

In the magnetic detection device 100 according to the first embodiment, the first magnetic sensor 10 and the second magnetic sensor 20 have the same shape. With this configuration, a mold to be used for molding of the first sealing body 11 and the second sealing body 21 can be shared. Accordingly, the manufacturing cost of the magnetic detection device 100 can be reduced. Further, with this configuration, common components having the same configuration can be used as the first magnetic sensor 10 and the second magnetic sensor 20. Accordingly, the manufacturing cost of the magnetic detection device 100 can be further reduced.

Second Embodiment

Figure 6:
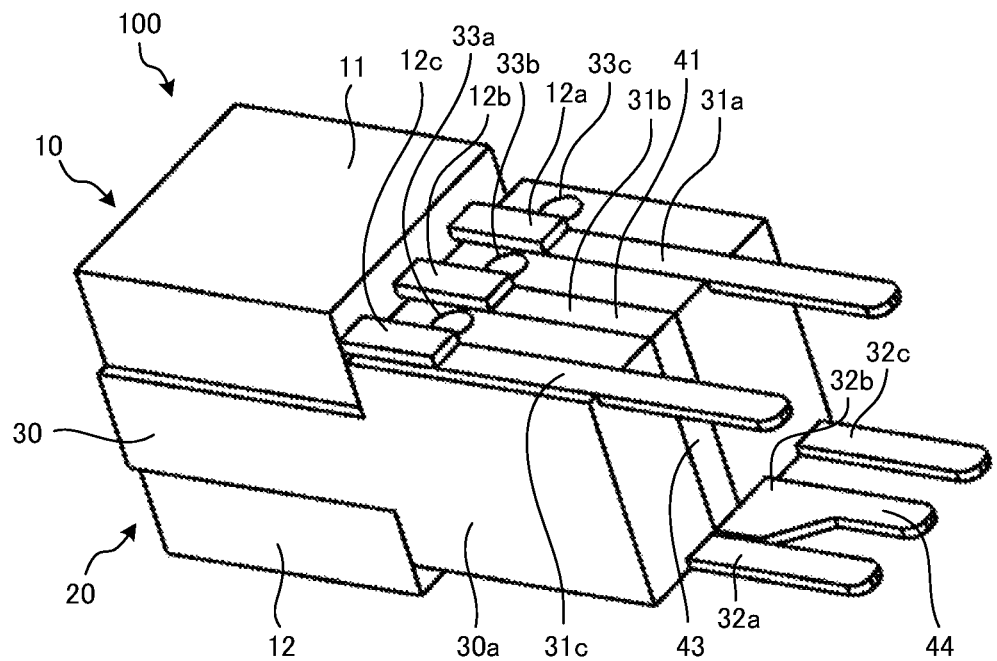
FIG. 6 is a perspective view for illustrating a configuration of a magnetic detection device according to a second embodiment.
Figure 7:
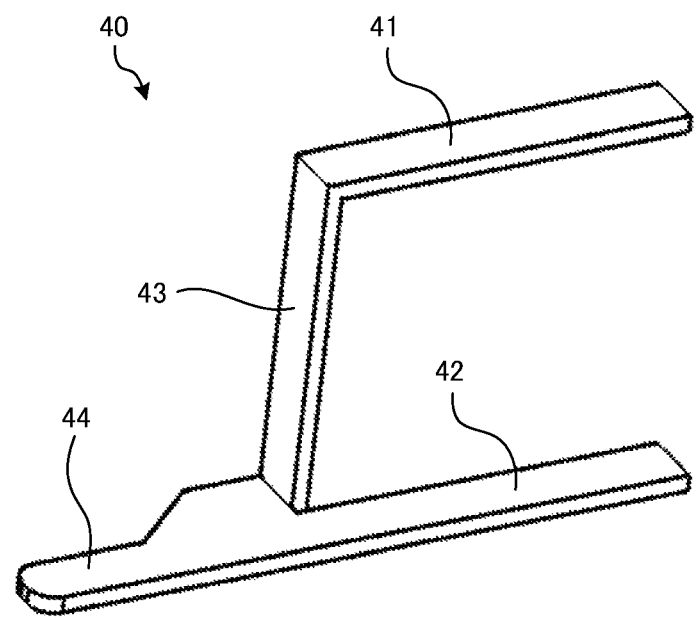
FIG. 7 is a perspective view for illustrating a configuration of a wiring component included in a resin body of the magnetic detection device according to the second embodiment.

A magnetic detection device according to a second embodiment is described. FIG. 6 is a perspective view for illustrating a configuration of the magnetic detection device according to the second embodiment. FIG. 7 is a perspective view for illustrating a configuration of a wiring component included in a resin body of the magnetic detection device according to the second embodiment. Components having the same functions and actions as those in the first embodiment are denoted by the same reference symbols, and description thereof is omitted.

In order to drive an IC, power supplying and grounding are required, and hence a power supply terminal and a ground terminal are provided in each of the first magnetic sensor 10 and the second magnetic sensor 20. In this manner, the magnetic detection device 100 including the two magnetic sensors is increased in the number of connector terminals including the power supply terminals and the ground terminals. When the number of connector terminals is increased, the magnetic detection device 100 is increased in size. In addition, when the number of connector terminals is increased, in some cases, a harness for connection to an external device is required to be added, and hence the cost of the magnetic detection device 100 is increased. Accordingly, it is preferred that the number of connector terminals of the magnetic detection device 100 be as small as possible.

As illustrated in FIG. 6 and FIG. 7, the resin body 30 in the second embodiment includes a wiring component 40. The wiring component 40 is formed integrally with the resin-body main body 30a by insert molding. The wiring component 40 includes a first wiring portion 41, a second wiring portion 42, a third wiring portion 43, and a terminal portion 44. The first wiring portion 41, the second wiring portion 42, the third wiring portion 43, and the terminal portion 44 all have a plate shape.

The first wiring portion 41 forms the first wiring line 31b. The first wiring portion 41 includes a contact electrode to be connected to the first terminal 12b. The second wiring portion 42 forms the second wiring line 32b adjacent to the first wiring line 31b as viewed in the normal direction of the first wiring line 31b. The second wiring portion 42 includes a contact electrode to be connected to the second terminal 22b.

The terminal portion 44 is connected to the second wiring portion 42. The terminal portion 44 protrudes from the resin-body main body 30a along an extending direction of the second wiring portion 42. The terminal portion 44 serves as a connector terminal to be connected to an external device. The terminal portion 44 is formed on the same plane as the second wiring portion 42. The third wiring portion 43 extends in the normal direction of the first wiring line 31a, and is configured to connect the first wiring portion 41 and the terminal portion 44 to each other. In this manner, the terminal portion 44 is electrically connected to both of the first terminal 12b of the first magnetic sensor 10 and the second terminal 22b of the second magnetic sensor 20.

The wiring component 40 has a configuration of being bifurcated into two branches in the normal direction of the first wiring line 31b. The wiring component 40 includes one connector terminal at one end portion thereof, and two contact electrodes at the other end portion thereof. The two contact electrodes are separated apart from each other in the normal direction of the first wiring line 31b. The wiring component 40 can be easily formed by punching a hoop material by a press machine and subjecting a punched-out plate material to bending.

In the second embodiment, similarly to the first embodiment, both of the welding between the first terminal and the first wiring line and the welding between the second terminal and the second wiring line can be performed by processing in a uniaxial direction. Accordingly, it is not required to divide the resin body 30 into two parts. Thus, the wiring component 40 in the second embodiment can form one resin body 30 together with other wiring lines such as the first wiring lines 31a and 31c and the second wiring lines 32a and 32c.

In the second embodiment, three first terminals 12a, 12b, and 12c and three second terminals 22a, 22b, and 22c are provided, but each of the number of first terminals and the number of second terminals is not limited to three. Further, in the second embodiment, one pair of the first terminal 12b and the second terminal 22b are connected to each other via the wiring component 40, but the number of pairs of the first terminals and the second terminals to be connected via the wiring component 40 is not limited to one.

As described above, in the magnetic detection device 100 according to the second embodiment, the resin body 30 includes at least one wiring component 40. The wiring component includes the first wiring portion 41, the second wiring portion 42, the terminal portion 44, and the third wiring portion 43. The first wiring portion 41 forms one first wiring line 31b among the plurality of first wiring lines 31a, 31b, and 31c. The second wiring portion 42 forms, among the plurality of second wiring lines 32a, 32b, and 32c, one second wiring line 32b adjacent to the above-mentioned one first wiring line 31b as viewed in the normal direction of the first wiring line 31b. The terminal portion 44 is connected to the second wiring portion 42, and protrudes from the resin-body main body 30a along the extending direction of the second wiring portion 42. The third wiring portion 43 connects the first wiring portion 41 and the terminal portion 44 to each other.

With this configuration, the first terminal 12b of the first magnetic sensor 10 and the second terminal 22b of the second magnetic sensor 20 can be connected to the common terminal portion 44. That is, the connector terminal to be connected to the first terminal 12b of the first magnetic sensor 10 and the connector terminal to be connected to the second terminal 22b of the second magnetic sensor 20 can be integrated into one. In this manner, the first magnetic sensor 10 and the second magnetic sensor 20 can have a common ground terminal, or the first magnetic sensor 10 and the second magnetic sensor 20 can have a common power supply terminal. Thus, according to the second embodiment, effects similar to those in the first embodiment can be obtained, and in addition, the magnetic detection device 100 can be decreased in size and also the cost of the magnetic detection device 100 can be reduced.

Third Embodiment

Figure 8:
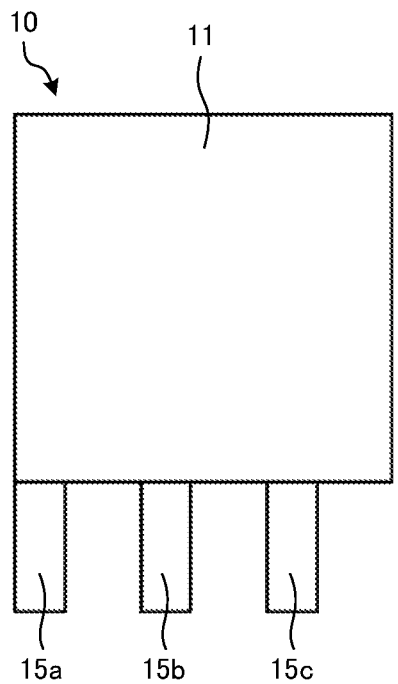
FIG. 8 is a top view for illustrating a configuration of a first magnetic sensor of a magnetic detection device according to a third embodiment.
Figure 9:
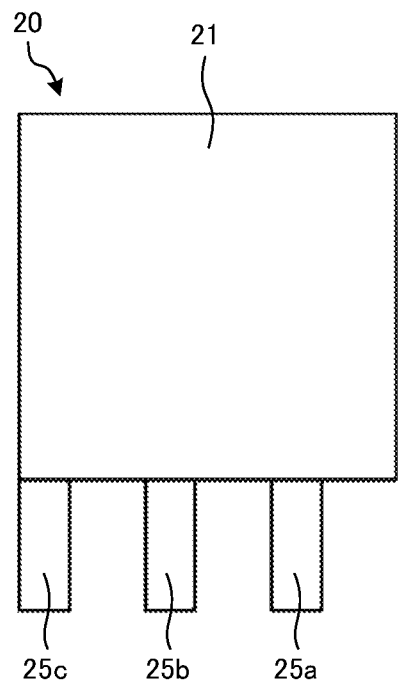
FIG. 9 is a top view for illustrating a configuration of a second magnetic sensor of the magnetic detection device according to the third embodiment.

A magnetic detection device according to a third embodiment is described. FIG. 8 is a top view for illustrating a configuration of a first magnetic sensor of the magnetic detection device according to the third embodiment. FIG. 9 is a top view for illustrating a configuration of a second magnetic sensor of the magnetic detection device according to the third embodiment. Components having the same functions and actions as those in the first embodiment or the second embodiment are denoted by the same reference symbols, and description thereof is omitted.

In the third embodiment, an array order of the terminals in the first magnetic sensor 10 is different from an array order of the terminals in the second magnetic sensor 20. That is, in the third embodiment, the first magnetic sensor 10 and the second magnetic sensor 20 are not common components having the same configuration.

As illustrated in FIG. 8, the first magnetic sensor 10 includes a power supply terminal 15a, a ground terminal 15b, and an output terminal 15c. Each of the power supply terminal 15a, the ground terminal 15b, and the output terminal 15c corresponds to the first terminal of the first magnetic sensor 10. The power supply terminal 15a, the ground terminal 15b, and the output terminal 15c are arrayed in the stated order from the left side to the right side of FIG. 8. The array order of the power supply terminal 15a, the ground terminal 15b, and the output terminal 15c in the first magnetic sensor 10 is not limited to the array order illustrated in FIG. 8.

As illustrated in FIG. 9, the second magnetic sensor 20 includes a power supply terminal 25a, a ground terminal 25b, and an output terminal 25c. Each of the power supply terminal 25a, the ground terminal 25b, and the output terminal 25c corresponds to the second terminal of the second magnetic sensor 20. The power supply terminal 25a, the ground terminal 25b, and the output terminal 25c are arrayed in the stated order from the right side to the left side of FIG. 9. That is, the array order of the power supply terminal 25a, the ground terminal 25b, and the output terminal 25c in top view of the second magnetic sensor 20 is reverse to the array order of the power supply terminal 15a, the ground terminal 15b, and the output terminal 15c in top view of the first magnetic sensor 10. The array order of the power supply terminal 25a, the ground terminal 25b, and the output terminal 25c in the second magnetic sensor 20 is not limited to the array order illustrated in FIG. 9.

Figure 10:
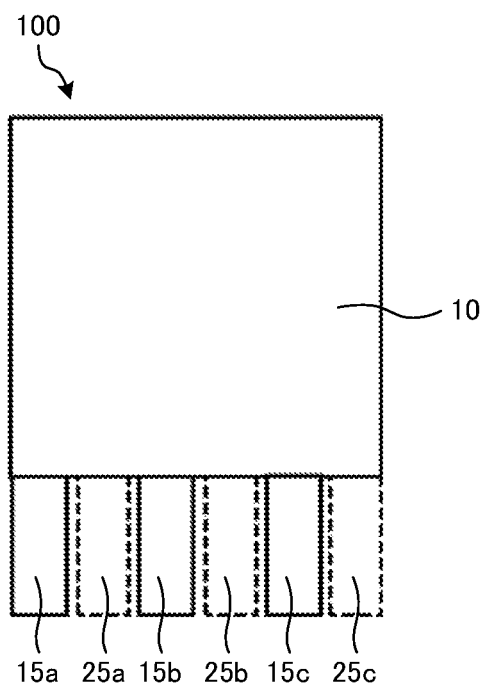
FIG. 10 is a top view for illustrating a configuration of the magnetic detection device according to the third embodiment.

FIG. 10 is a top view for illustrating the configuration of the magnetic detection device according to the third embodiment. FIG. 10 shows the configuration of the magnetic detection device 100 as viewed from the first magnetic sensor 10 side, along the thickness direction of the magnetic detection device 100. In FIG. 10, illustration of the resin body 30 is omitted.

In the magnetic detection device 100, the first magnetic sensor 10 and the second magnetic sensor 20 are arranged to face each other. Accordingly, as illustrated in FIG. 10, as viewed in the thickness direction of the magnetic detection device 100, the array order of the power supply terminal 15a, the ground terminal 15b, and the output terminal 15c is the same as the array order of the power supply terminal 25a, the ground terminal 25b, and the output terminal 25c. In this manner, as viewed in the thickness direction of the magnetic detection device 100, the power supply terminal 15a and the power supply terminal 25a are adjacent to each other, and the ground terminal 15b and the ground terminal 25b are adjacent to each other.

Although not shown, the resin body 30 in the third embodiment is formed through use of two wiring components 40 in the second embodiment. Specifically, the resin body 30 is formed through use of the wiring component 40 configured to electrically connect the power supply terminal 15a and the power supply terminal 25a to each other, and the wiring component 40 configured to electrically connect the ground terminal 15b and the ground terminal 25b to each other. In this manner, in the magnetic detection device 100 of the third embodiment, the power supply terminal 15a and the power supply terminal 25a are connected to the connector terminal of one wiring component 40, and the ground terminal 15b and the ground terminal 25b are connected to the connector terminal of the other wiring component 40. Accordingly, in the third embodiment, two connector terminals can be reduced. Thus, the magnetic detection device 100 can be decreased in size, and the cost of the magnetic detection device 100 can be reduced.

As described above, in the magnetic detection device 100 according to the third embodiment, the resin body 30 includes a plurality of wiring components 40. The plurality of first terminals include at least the power supply terminal 15a and the ground terminal 15b of the first magnetic sensor 10. The plurality of second terminals include at least the power supply terminal 25a and the ground terminal 25b of the second magnetic sensor 20. As viewed in the above-mentioned normal direction, the power supply terminal 15a of the first magnetic sensor 10 and the power supply terminal 25a of the second magnetic sensor 20 are adjacent to each other. The power supply terminal 15a of the first magnetic sensor 10 and the power supply terminal 25a of the second magnetic sensor 20 are connected to each other via one wiring component 40 among the plurality of wiring components 40. As viewed in the above-mentioned normal direction, the ground terminal 15b of the first magnetic sensor 10 and the ground terminal 25b of the second magnetic sensor 20 are adjacent to each other. The ground terminal 15b of the first magnetic sensor 10 and the ground terminal 25b of the second magnetic sensor 20 are connected to each other via a different one wiring component 40 among the plurality of wiring components 40.

According to the third embodiment, effects similar to those in the first embodiment can be obtained, and in addition, two connector terminals can be reduced. Thus, the magnetic detection device 100 can be decreased in size, and the cost of the magnetic detection device 100 can be reduced.

Fourth Embodiment

Figure 11:
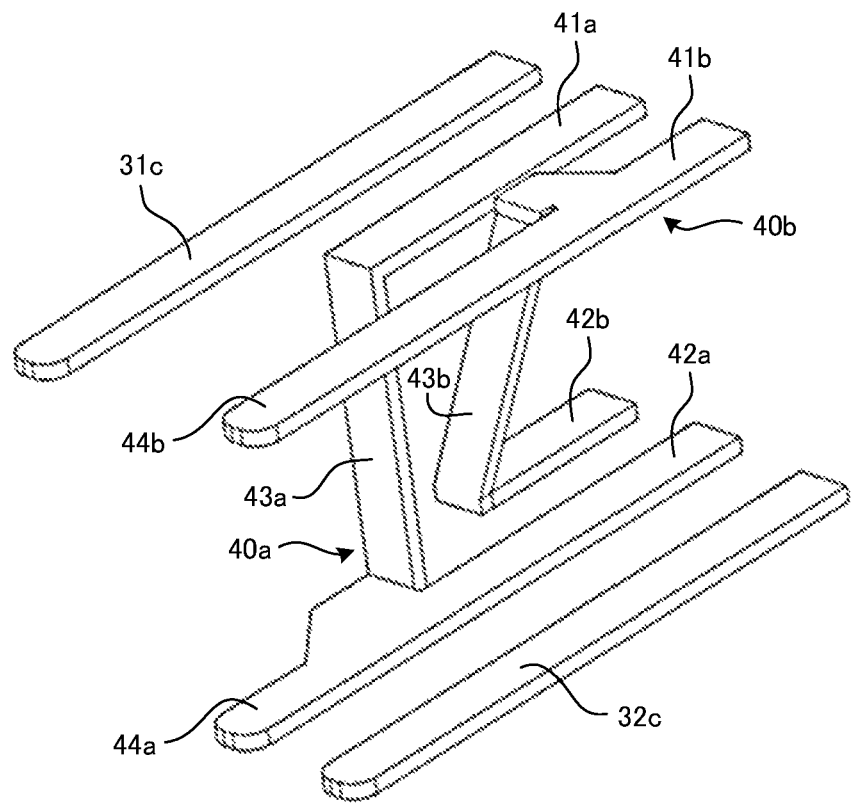
FIG. 11 is a perspective view for illustrating a configuration of two wiring components included in a resin body of a magnetic detection device according to a fourth embodiment.

A magnetic detection device according to a fourth embodiment is described. The resin body 30 in the fourth embodiment is formed through use of two wiring components 40. FIG. 11 is a perspective view for illustrating a configuration of the two wiring components included in the resin body of the magnetic detection device according to the fourth embodiment. As illustrated in FIG. 11, a wiring component 40*a* corresponding to one wiring component 40 has a configuration similar to that of the wiring component 40 illustrated in FIG. 6 and FIG. 7. The wiring component 40*a* includes a first wiring portion 41*a*, a second wiring portion 42*a*, a third wiring portion 43*a*, and a terminal portion 44*a*. The first wiring portion 41*a* is connected to the ground terminal of the first magnetic sensor 10. The second wiring portion 42*a* is connected to the ground terminal of the second magnetic sensor 20. The terminal portion 44*a* is connected to the second wiring portion 42*a*, and is formed on the same plane as the second wiring portion 42*a*. The terminal portion 44*a* serves as a connector terminal to be connected to an external device. The third wiring portion 43*a* extends in a normal direction of the first wiring portion 41*a*, and is configured to connect the first wiring portion 41*a* to the second wiring portion 42*a* and the terminal portion 44*a*. That is, the wiring component 40*a* is configured to electrically connect the ground terminal of the first magnetic sensor 10 and the ground terminal of the second magnetic sensor 20 to each other.

A wiring component 40*b* corresponding to the other wiring component 40 includes a first wiring portion 41*b*, a second wiring portion 42*b*, a third wiring portion 43*b*, and a terminal portion 44*b*. The first wiring portion 41*b* is connected to the power supply terminal of the first magnetic sensor 10. The terminal portion 44*b* is connected to the first wiring portion 41*b*, and is formed on the same plane as the first wiring portion 41*b*. The terminal portion 44*b* serves as a connector terminal to be connected to the external device. The second wiring portion 42*b* is connected to the power supply terminal of the second magnetic sensor 20. The third wiring portion 43*b* extends obliquely with respect to the extending direction of the third wiring portion 43*a*, and is configured to connect the first wiring portion 41*b* and the terminal portion 44*b* to the second wiring portion 42*b*. That is, the wiring component 40*b* is configured to electrically connect the power supply terminal of the first magnetic sensor 10 and the power supply terminal of the second magnetic sensor 20 to each other.

As viewed in the normal direction of the first wiring portion 41*a*, that is, in the thickness direction of the magnetic detection device 100, the first wiring portion 41*a* of the wiring component 40*a* and the third wiring portion 43*b* of the wiring component 40*b* three-dimensionally intersect with each other inside the resin body 30. That is, the wiring component 40*a* and the wiring component 40*b* intersect with each other as viewed in the thickness direction of the magnetic detection device 100, but are electrically insulated from each other.

According to the fourth embodiment, even when the power supply terminal 15*a* and the power supply terminal 25*a* are not adjacent to each other as viewed in the thickness direction of the magnetic detection device 100, the power supply terminal 15*a* and the power supply terminal 25*a* can be connected to each other via the wiring component 40*b*. Further, even when the ground terminal 15*b* and the ground terminal 25*b* are not adjacent to each other as viewed in the thickness direction of the magnetic detection device 100, the ground terminal 15*b* and the ground terminal 25*b* can be connected to each other via the wiring component 40*a*. Thus, according to the fourth embodiment, regardless of the array order of the terminals in each of the first magnetic sensor 10 and the second magnetic sensor 20, two connector terminals can be reduced. That is, even when the first magnetic sensor 10 and the second magnetic sensor 20 have the same shape as in the first embodiment, two connector terminals can be reduced, and hence the manufacturing cost of the magnetic detection device 100 can be further reduced.

As described above, in the magnetic detection device 100 according to the fourth embodiment, the resin body 30 includes a plurality of wiring components 40. One wiring component 40*a* among the plurality of wiring components 40 and a different one wiring component 40*b* among the plurality of wiring components 40 three-dimensionally intersect with each other inside the resin body 30.

According to the fourth embodiment, effects similar to those in the first embodiment can be obtained, and in addition, two connector terminals can be reduced regardless of the array order of the terminals in each of the first magnetic sensor 10 and the second magnetic sensor 20. Thus, the manufacturing cost of the magnetic detection device 100 can be further reduced.

Fifth Embodiment

A magnetic detection device according to a fifth embodiment is described. In the fifth embodiment, in order to improve the accuracy of the magnetic detection device, a high-sensitive magnetic resistance element, for example, a giant magnetic resistance (GMR) element is used as a magnetoelectric conversion device. In order to detect the unevenness of the unmagnetized magnetic rotating body with the magnetic sensor having the magnetic resistance element mounted thereon, it is required to apply a bias magnetic field to the magnetic resistance element. The magnetic sensor detects the bias magnetic field which changes in accordance with the unevenness of the magnetic rotating body.

Figure 12:
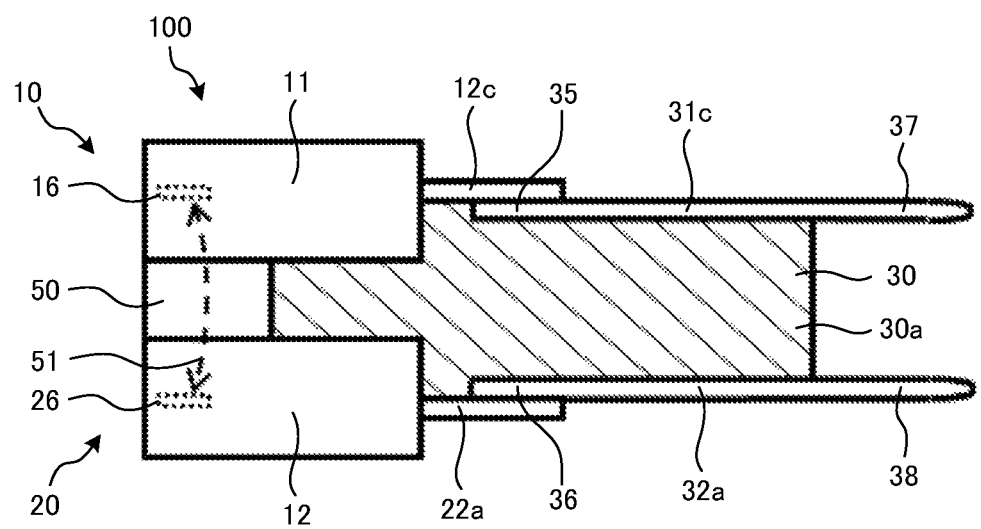
FIG. 12 is a side view for illustrating a configuration of a magnetic detection device according to a fifth embodiment.
Figure 13:
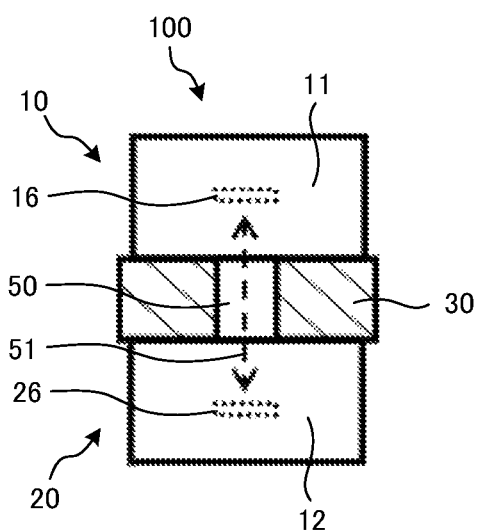
FIG. 13 is a front view for illustrating the configuration of the magnetic detection device according to the fifth embodiment.

FIG. 12 is a side view for illustrating the configuration of the magnetic detection device according to the fifth embodiment. FIG. 13 is a front view for illustrating the configuration of the magnetic detection device according to the fifth embodiment. FIG. 13 shows the configuration of the magnetic detection device 100 as viewed from the magnetic rotating body 200 side. Components having the same functions and actions as those of any of the first to fourth embodiments are denoted by the same reference symbols, and description thereof is omitted.

As illustrated in FIG. 12 and FIG. 13, a first detection element 16 is provided inside of the first sealing body 11 of the first magnetic sensor 10. A second detection element 26 is provided inside of the second sealing body 21 of the second magnetic sensor 20. Each of the first detection element 16 and the second detection element 26 is a magnetic resistance element. A magnet 50 is provided between the first sealing body 11 and the second sealing body 21. The magnet 50 is magnetized along the thickness direction of the magnetic detection device 100. One magnetic pole surface of the magnet 50 is opposed to the first detection element 16. The other magnetic pole surface of the magnet 50 is opposed to the second detection element 26. A bias magnetic field 51 is applied by the magnet 50 to both of the first detection element 16 and the second detection element 26.

In order to improve the detection accuracy of the magnetic detection device 100, it is required to apply the bias magnetic field 51 at the same magnitude and the same angle from the magnetic pole surfaces of the magnet 50 to the first detection element 16 and the second detection element 26, respectively. Accordingly, as viewed from the magnetic rotating body 200 side as illustrated in FIG. 13, a center of each of the first detection element 16 and the second detection element 26 is arranged on a magnetization axis of the magnet 50.

As described above, in the magnetic detection device 100 according to the fifth embodiment, each of the first detection element 16 and the second detection element 26 is a magnetic resistance element. The magnetic detection device 100 further includes the magnet 50 configured to apply the bias magnetic field 51 to the first detection element 16 and the second detection element 26.

According to the fifth embodiment, effects similar to those in the first embodiment can be obtained, and in addition, the detection accuracy of the magnetic detection device 100 can be improved through use of the magnetic resistance element.

What is claimed is:

1. A magnetic detection device, comprising:
    a first magnetic sensor;
    a second magnetic sensor arranged so as to be opposed to the first magnetic sensor; and
    a resin body provided between the first magnetic sensor and the second magnetic sensor,
    wherein the first magnetic sensor includes:
        a first sealing body in which a first detection element is sealed; and
        a plurality of first terminals each of which protrudes from the first sealing body in one direction, and are arranged side by side with respect to each other,
    wherein each of the plurality of first terminals has a plate shape along an arrangement direction of the plurality of first terminals,
    wherein the second magnetic sensor includes:
        a second sealing body in which a second detection element is sealed; and
        a plurality of second terminals each of which protrudes from the second sealing body in the same direction as a protruding direction of each of the plurality of first terminals, and are arranged side by side with respect to each other,
    wherein each of the plurality of second terminals has a plate shape which is parallel to each of the plurality of first terminals,
    wherein the resin body includes:
        a resin-body main body;
        a plurality of first wiring lines formed on a surface of the resin-body main body on the first magnetic sensor side; and
        a plurality of second wiring lines formed on a surface of the resin-body main body on the second magnetic sensor side,
    wherein each of the plurality of first wiring lines has a plate shape which is parallel to each of the plurality of first terminals,
    wherein each of the plurality of first wiring lines includes a first overlapping portion overlapping with corresponding one of the plurality of first terminals,
    wherein, as viewed in a normal direction of each of the plurality of first terminals, the first overlapping portion is arranged at a position shifted from all of the plurality of second terminals and the plurality of second wiring lines,
    wherein each of the plurality of first wiring lines is welded to corresponding one of the plurality of first terminals at the first overlapping portion,
    wherein each of the plurality of second wiring lines has a plate shape which is parallel to each of the plurality of first terminals,
    wherein each of the plurality of second wiring lines includes a second overlapping portion overlapping with corresponding one of the plurality of second terminals,
    wherein, as viewed in the normal direction, the second overlapping portion is arranged at a position shifted from all of the plurality of first terminals and the plurality of first wiring lines, and
    wherein each of the plurality of second wiring lines is welded to corresponding one of the plurality of second terminals at the second overlapping portion.

2. The magnetic detection device according to claim 1,
    wherein, in the surface of the resin-body main body on the first magnetic sensor side, a plurality of first holes are formed,
    wherein each of the plurality of first holes extends in the normal direction to reach the second overlapping portion of corresponding one of the plurality of second wiring lines,
    wherein, in the surface of the resin-body main body on the second magnetic sensor side, a plurality of second holes are formed, and
    wherein each of the plurality of second holes extends in the normal direction to reach the first overlapping portion of corresponding one of the plurality of first wiring lines.

3. The magnetic detection device according to claim 1, wherein the first magnetic sensor and the second magnetic sensor have the same shape.

4. The magnetic detection device according to claim 1,
    wherein the resin body includes at least one wiring component, and
    wherein the at least one wiring component includes:
        a first wiring portion forming one first wiring line among the plurality of first wiring lines;
        a second wiring portion forming, among the plurality of second wiring lines, one second wiring line adjacent to the one first wiring line as viewed in the normal direction;
        a terminal portion which is connected to the second wiring portion, and protrudes from the resin-body main body along an extending direction of the second wiring portion; and
        a third wiring portion configured to connect the first wiring portion and the terminal portion to each other.

5. The magnetic detection device according to claim 4,
    wherein the at least one wiring component comprises a plurality of wiring components,
    wherein the plurality of first terminals include at least a power supply terminal and a ground terminal of the first magnetic sensor,
    wherein the plurality of second terminals include at least a power supply terminal and a ground terminal of the second magnetic sensor,
    wherein, as viewed in the normal direction, the power supply terminal of the first magnetic sensor and the power supply terminal of the second magnetic sensor are adjacent to each other, wherein the power supply terminal of the first magnetic sensor and the power supply terminal of the second magnetic sensor are connected to each other via one wiring component among the plurality of wiring components, wherein, as viewed in the normal direction, the ground terminal of the first magnetic sensor and the ground terminal of the second magnetic sensor are adjacent to each other, and wherein the ground terminal of the first magnetic sensor and the ground terminal of the second magnetic sensor are connected to each other via a different one wiring component among the plurality of wiring components.

6. The magnetic detection device according to claim 4, wherein the at least one wiring component comprises a plurality of wiring components, and wherein one wiring component among the plurality of wiring components and a different one wiring component among the plurality of wiring components three-dimensionally intersect with each other inside the resin body.

7. The magnetic detection device according to claim 1, wherein each of the first detection element and the second detection element is a magnetic resistance element, and wherein the magnetic detection device further comprises a magnet configured to apply a bias magnetic field to the first detection element and the second detection element.

\* \* \* \* \*